(12) United States Patent
Saito et al.

(10) Patent No.: US 7,746,973 B2
(45) Date of Patent: *Jun. 29, 2010

(54) SIGNAL DETECTION CIRCUIT

(75) Inventors: Hiroshi Saito, Ota (JP); Yasuhiro Kaneta, Isesaki (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 8 days.

This patent is subject to a terminal disclaimer.

(21) Appl. No.: 12/123,383

(22) Filed: May 19, 2008

(65) Prior Publication Data

US 2008/0292044 A1    Nov. 27, 2008

(30) Foreign Application Priority Data

May 24, 2007   (JP)   ............................. 2007-138401

(51) Int. Cl.
    *H03K 23/00*   (2006.01)
(52) U.S. Cl. .................. 377/118; 377/119; 324/253
(58) Field of Classification Search .................. None
    See application file for complete search history.

(56) References Cited

U.S. PATENT DOCUMENTS

| | | | |
|---|---|---|---|
| 4,918,824 A | | 4/1990 | Farrar |
| 5,229,725 A | * | 7/1993 | Spaeder et al. ............... 324/522 |
| 5,335,254 A | * | 8/1994 | Tu et al. ...................... 377/76 |
| 5,977,944 A | * | 11/1999 | Kubota et al. ................ 345/100 |
| 6,166,539 A | | 12/2000 | Dahlberg et al. |
| 6,268,725 B1 | * | 7/2001 | Vernon et al. ................ 324/253 |
| 6,411,080 B1 | * | 6/2002 | Bach et al. ................... 324/173 |
| 6,489,817 B1 | * | 12/2002 | Wong et al. .................. 327/115 |

(Continued)

FOREIGN PATENT DOCUMENTS

JP   8-285929   11/1996

(Continued)

OTHER PUBLICATIONS

European Patent Office, Extended European Search Report for Application No. 06254747.6-2216, Apr. 9, 2009.

(Continued)

*Primary Examiner*—Tuan Lam
(74) *Attorney, Agent, or Firm*—SoCal IP Law Group LLP; Steven C. Sereboff; John E. Gunther

(57) ABSTRACT

A signal detection circuit comprising: a differential amplifier to which an output voltage of a detection coil of a magnetic sensor is to be applied; a comparator to output a digital signal being at one logic level in a period between two spike-shaped voltages adjacent to each other in the output voltage of the differential amplifier; and a count circuit to perform a count operation in a period during which the comparator outputs the digital signal of the one logic level, the count circuit including a first counter to count a first clock having a predetermined frequency, a second counter to count a second clock being equal in frequency to and different in phase from the first clock, the second counter having the same number of bits as the number of bits of the first counter, and an adder to add count values of the first and the second counter.

4 Claims, 5 Drawing Sheets

U.S. PATENT DOCUMENTS

| | | | |
|---|---|---|---|
| 6,767,507 B1 * | 7/2004 | Woo et al. | 422/5 |
| 7,355,398 B2 * | 4/2008 | Kobayashi et al. | 324/253 |
| 7,391,211 B2 * | 6/2008 | Cripe | 324/253 |
| 7,466,789 B2 * | 12/2008 | Rieubon et al. | 377/94 |
| 2007/0057670 A1 | 3/2007 | Kobayashi et al. | |

FOREIGN PATENT DOCUMENTS

| | | |
|---|---|---|
| JP | 2005-61969 | 3/2005 |
| JP | 2005-147947 | 6/2005 |
| JP | 2007-078423 | 3/2007 |

OTHER PUBLICATIONS

USPTO, Notice of Allowance for U.S. Appl. No. 11/531,198 mail date Sep. 28, 2009.

* cited by examiner

SIGNAL DETECTION CIRCUIT

CROSS-REFERENCE TO RELATED APPLICATION

This application claims the benefit of priority to Japanese Patent Application No. 2007-138401, filed May 24, 2007, of which full contents are incorporated herein by reference.

BACKGROUND OF THE INVENTION

1. Field of the Invention

The present invention relates to a signal detection circuit.

2. Description of the Related Art

There is known a fluxgate magnetometer utilizing nonlinear magnetization characteristic of a ferromagnet. There is known, as an example, a fluxgate magnetometer configured with an exciting coil drive circuit, a magnetic sensor, and a signal detection circuit of the magnetic sensor (see Japanese Patent Application Laid-Open Publication No. 2007-78423).

A signal detection circuit of this magnetic sensor periodically saturates a magnetic flux of the exciting coil in the magnetic sensor with a periodic drive signal input from the exciting coil drive circuit to detect an induced voltage waveform of an induced detection coil in the magnetic sensor by variations in density of the magnetic flux. When an external magnetic field is applied, since saturation time intervals are varied depending on intensity of the external magnetic field, information about direction, etc., of the external magnetic field can be obtained by counting adjacent intervals of the detected voltage waveform with a counter including in the signal detection circuit of the magnetic sensor.

Since the fluxgate magnetometer measures a plurality of magnetic fields relative to a spatial axis direction, a multiplicity of direction data are required to be handled. Therefore, a highly accurate counter is required to be included in the signal detection circuit of the magnetic sensor to obtain information of the external magnetic field.

However, since the signal detection circuit of the magnetic sensor is required to be highly accurate and stable at the same time, when preparing the highly accurate counter, there is a problem that an increase in the number of constituent bits of a counter or an increase in frequency of a clock signal are inappropriate because generation of noises, an increase in cost, etc., are caused.

SUMMARY OF THE INVENTION

A signal detection circuit according to an aspect of the present invention comprises: a differential amplifier to which an output voltage of a detection coil of a magnetic sensor is to be applied; a comparator configured to output a digital signal being at one logic level in a period between two spike-shaped voltages adjacent to each other in the output voltage of the differential amplifier; and a count circuit configured to perform a count operation in a period during which the comparator outputs the digital signal of the one logic level, the count circuit including a first counter configured to count a first clock having a predetermined frequency, a second counter configured to count a second clock being equal in frequency to and different in phase from the first clock, the second counter having the same number of bits as the number of bits of the first counter, and an adder configured to add count values of the first counter and the second counter.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Configuration of Fluxgate Magnetometer

Figure 3:
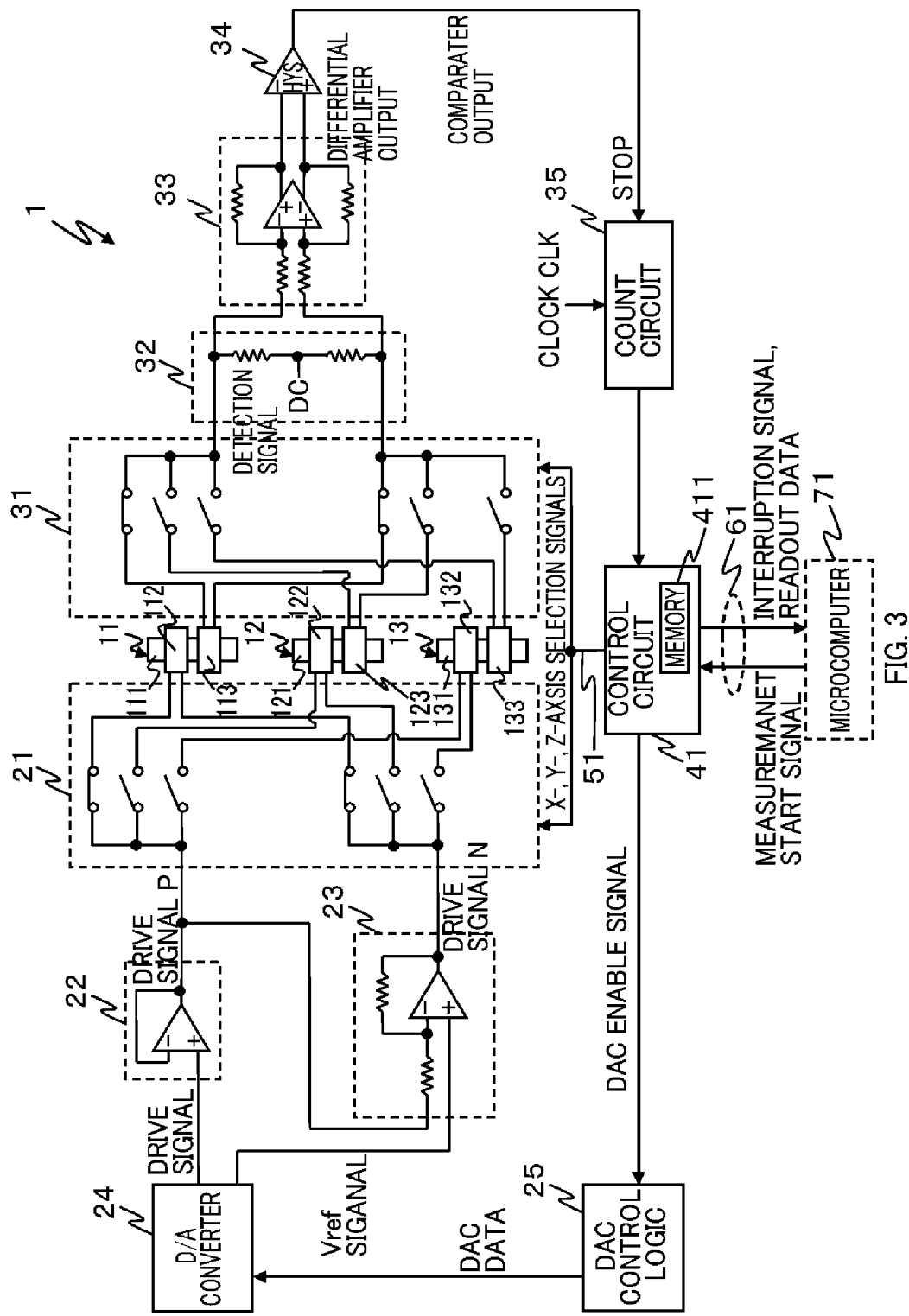
FIG. 3 is a diagram showing a configuration of a fluxgate magnetometer described as one embodiment of the present invention.

FIG. 3 shows a configuration of a fluxgate magnetometer described as one embodiment of the present invention. A fluxgate magnetometer shown in FIG. 3 includes three magnetic sensors 11, 12, and 13 corresponding to the X-axis, the Y-axis, and the Z-axis, respectively. The magnetic sensors 11, 12, and 13 are configured such that exciting coils 112, 122, and 132 and detection coils 113, 123, and 133 are respectively wound around magnetic cores 111, 121, and 131 made of a soft magnetic material such as a nano-crystalline soft magnetic material. The exciting coils 112, 122, and 132 are driven by an exciting coil drive circuit including an exciting-side switch circuit 21, a noninverting amplifier 22, an inverting amplifier 23, a D/A converter 24, and a control logic (hereinafter, referred to as a DAC control logic 25) controlling the D/A converter 24 as to an operation. The output voltage of the detection coils 113, 123, and 133 is processed by a signal detection circuit including a detection-side switch circuit 31, a voltage adjustment circuit 32 adjusting an output voltage to a predetermined voltage level, a differential amplifier 33 amplifying the output voltage, a hysteresis comparator 34 outputting a low-level digital signal STOP during a period between two occurrences of spike-shaped voltages included in the output voltage, and a count circuit 35 counting the number of pulses of the clock CLK in a period during which the digital signal STOP output from the hysteresis comparator 34 is low-level. The clock CLK may be self-oscillating or non-self-oscillating.

A control circuit 41 controls a DAC control logic 25. The control circuit 41 receives a count value input from the count circuit 35 to be stored in an internal memory 411. The control circuit 41 is connected to the exciting-side switch circuit 21 and the detection-side switch circuit 31 via a control line 51, and the control circuit 41 controls the switch 21 and the switch 31 as to open/close (off/on) through the control line 51. The control circuit 41 is communicably connected to a microcomputer 71 (external apparatus) through a bus line 61 and transmits the count value stored in the memory 411 to the microcomputer 71 as needed.

Operation of Fluxgate Magnetometer

Figure 4:
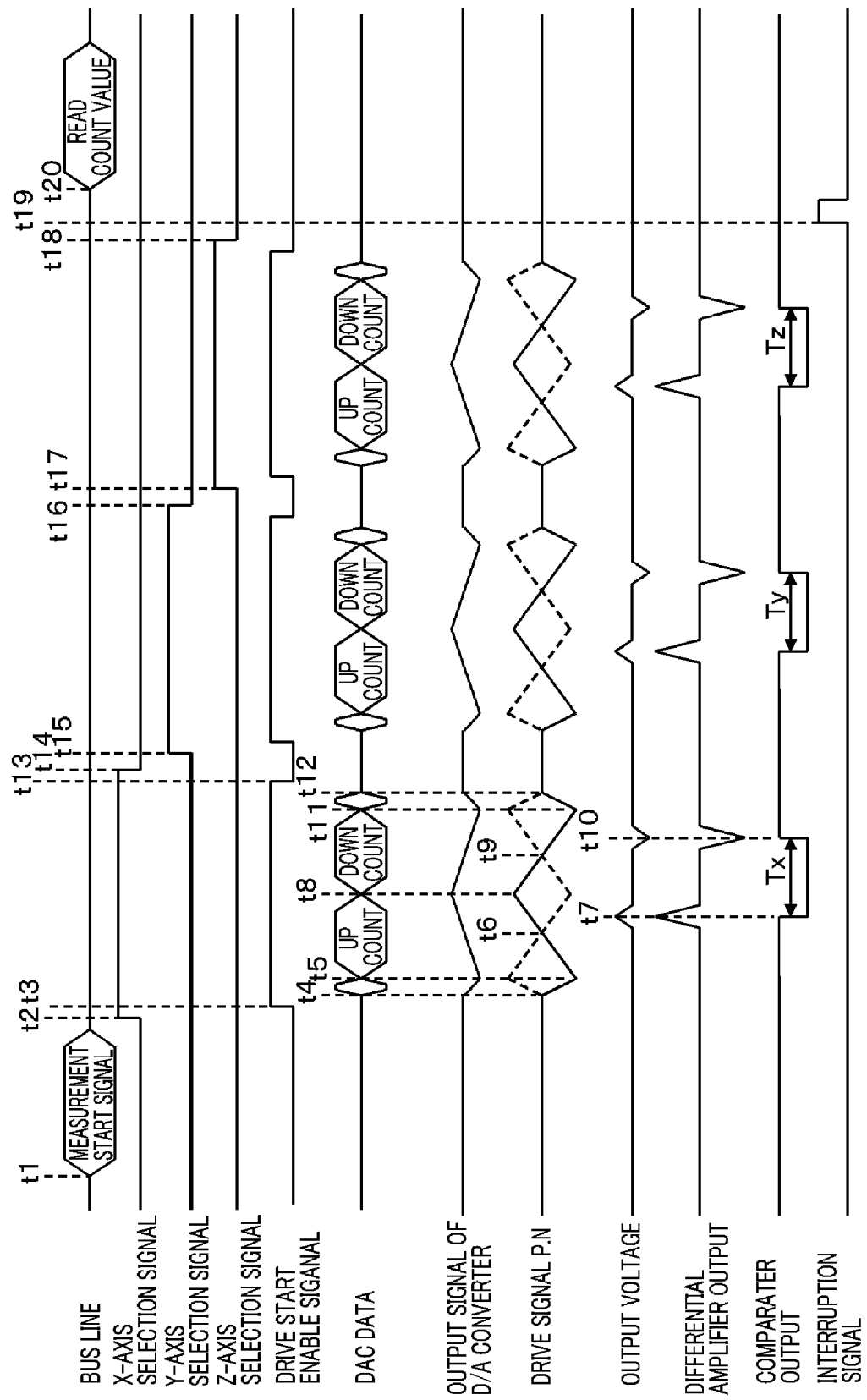
FIG. 4 is a timing chart of an operation of a fluxgate magnetometer shown in FIG. 4.

FIG. 4 is a timing chart of an operation of the fluxgate magnetometer 1 of this embodiment. The operation of the fluxgate magnetometer 1 will hereinafter be described with reference to the timing chart shown in FIG. 4. In the following description, all the contacts of the exciting-side switch circuit 21 and the detection-side switch circuit 31 are assumed to be opened (off) in advance.

As shown in FIG. 4, first, a measurement start signal is input from the microcomputer 71 to the control circuit 41 through the bus line 61 (t1). When the measurement start signal is input, the control circuit 41 then outputs a signal for closing the X-axis contacts (hereinafter, referred to as X-axis selection signal) to the exciting-side switch circuit 21 and the detection-side switch circuit 31 (t2). When the X-axis selection signal is input, the exciting-side switch circuit 21 and the detection-side switch circuit 31 open the contacts of the exciting coil 112 and the detection coil 113 of the magnetic sensor 11 for measuring the magnetic field in the X-axis direction. In this way, there are selected, by the exciting-side switch circuit 21, the exciting coils 112, 122, 132 to which a drive signal P and a drive signal N, which will be described later, are applied.

The control circuit 41 then outputs a drive start enable signal to the DAC control logic 25 (t3). When the drive start enable signal is input, the DAC control logic 25 inputs DAC data to the D/A converter 24. Specifically, down count data is first input as the DAC data (t4 to t5). By the down count data, there is added a signal for prevent: a high-voltage back electromotive force causing damage to the circuit elements such as the noninverting amplifier 22 and the inverting amplifier 23; from occurring in the exciting coil 112, immediately before a voltage-rising period described later. The DAC control logic 25 then stops an output of the down count data to the D/A converter 24 at t5 and then outputs the up count data. This causes the D/A converter 24 to output a signal based on the up count data during a voltage-rising period in a triangular wave which will be described later (t5 to t8).

The DAC control logic 25 stops the output of the up count data to the D/A converter 24 at t8 and then outputs the down count data. This causes the D/A converter 24 to output a signal based on the down count data during a voltage-falling period in the triangular wave which will be described later (t8 to t11). The DAC control logic 25 then stops the output of the down count data to the D/A converter 24 at t11 and outputs the up count data. By the up count data, there is added a signal for preventing: a high-voltage back electromotive force causing damage to the circuit elements such as the noninverting amplifier 22 and the inverting amplifier 23; from occurring in the exciting coil, immediately after the above voltage-falling period. The triangular wave is a waveform of a signal output from D/A converter 24 during a period from t5 to t11, for example. The voltage-rising period in the triangular wave indicates a period from t5 to t8 in the period from t5 to t11, for example, and the voltage-falling period in the triangular wave indicates a period from t8 to t11 in the period from t5 to t11.

The drive signal of the D/A converter 24 is supplied to a noninverting input terminal of the noninverting amplifier 22. The Vref signal of the D/A converter 24 is supplied to the noninverting input terminal of the inverting amplifier 23. An output of the noninverting amplifier 22 is negatively fed back to the inverting input terminal of the noninverting amplifier 22. The output of the noninverting amplifier 22 is input to an inverting input terminal of the inverting amplifier 23. As a result, the noninverting amplifier 22 outputs a signal, shown by a solid line in FIG. 4 (hereinafter, referred to as the drive signal P), which is obtained by amplifying an output signal of the D/A converter 24; and the inverting amplifier 23 outputs a signal, shown by a dashed line in FIG. 4 (hereinafter, referred to as the drive signal N), which is obtained by inverting the drive signal P.

The drive signal P output from the noninverting amplifier 22 is applied to one of the two terminals of the exciting coil 112. The drive signal N output from the inverting amplifier 23 is applied to the other one of the two terminals of the exciting coil 112. Therefore, a difference voltage (hereinafter, this voltage is referred to as an exciting voltage) between the drive signal P and the drive signal N is applied to the exciting coil 112.

As shown in FIG. 4, the spike-shaped voltage (t7, t10) generated between the terminals of the detection coil 113 is generated due to electromotive force generated in a non-saturated section in the B-H curve (B: magnetic flux density, H: magnetic field) of the magnetic sensor 11. A time interval (Tx) between the two spike-shaped voltages at t7 and t10 is changed according to an external magnetic field ΔH applied to the magnetic sensor 11. That is, information about intensity, etc., of the external magnetic field ΔH can be acquired by measuring the time interval (Tx) between the two spike-shaped voltages to be output.

The spike-shaped voltage generated in the detection coil 113 is converted into a voltage with a predetermined level by the voltage adjustment circuit 32, and thereafter, input to the differential amplifier 33 for amplification. An output voltage amplified by the differential amplifier 33 is input to the hysteresis comparator 34.

The hysteresis comparator 34 outputs the digital signal STOP, which is at a low-level during a period between the occurrences of spike-shaped voltages adjacent to each other included in the output voltage and at a high-level during other periods. In an initial state, the hysteresis comparator 34 outputs a high-level. The hysteresis comparator 34 starts the output of low-level at the timing of the input of the spike-shaped voltage generated due to the polarity reversal in the exciting voltage at t6 (t7). The hysteresis comparator 34 switches the output to high-level at the timing of the input of the spike-shaped voltage generated due to the polarity reversal in the exciting voltage at t9 (t10).

The digital signal STOP output from the hysteresis comparator 34 is input to the count circuit 35. To the count circuit 35, the clock CLK is input, and the count circuit 35 counts the number of pulses of the clock CLK in a period during which the digital signal STOP output from the hysteresis comparator 34 is at low-level. When the digital signal STOP becomes high-level and counting of the number of pulses is completed, the count circuit 35 outputs a count value to the control circuit 41. The control circuit 41 stores the input count value into the memory 411.

The control circuit 41 prohibits the drive start enable signal from being input to the DAC control logic 25 (t13). The control circuit 41 stops the input of the X-axis selection signal to the exciting-side switch circuit 21 and the detection-side switch circuit 31 (t14). As a result of this, there are opened the contacts of the exciting coil 112 and the detection coil 113 of the magnetic sensor 11 for measuring the magnetic field in the X-axis direction.

The control circuit 41 then transmits a signal for closing the Y-axis contacts (hereinafter, referred to as the Y-axis selection signal) to the exciting-side switch circuit 21 and the detection-side switch circuit 31 (t15). As a result of this, the process for the Y-axis is started. The process for the Y-axis executed in a period from t15 to t16 is executed as is the case with the X-axis. The process for the Z-axis executed in a period from t17 to t18 is also executed as is the case with the X-axis.

As described above, when there are stored in the memory 411 each of the count values for the X-axis, the Y-axis, and the Z-axis, the control circuit 41 transmits to the microcomputer 71 an interruption signal for indicating completion of writing of the count values (t19). When receiving the interruption signal, the microcomputer 71 transmits a readout request to the control circuit 41. This causes the microcomputer 71 to read the count values for the X-axis, the Y-axis, and the Z-axis stored in the memory 411 of the control circuit 41 (t20). The count values transmitted to the microcomputer 71 can obtain direction data indicating a direction, for example, by being subjected to a calculation process by a calculating unit (not shown) within the microcomputer 71 as needed.

The fluxgate magnetometer 1 of an embodiment according to the present invention can perform a measurement with high precision than in the case of using an analog circuit such as integrating circuit, since time intervals (Tx, Ty, Tz) of two spike-shaped voltages are measured by counting the number of pulses of the clock with the count circuit 35.

Configuration of Count Circuit 35

Figure 1:
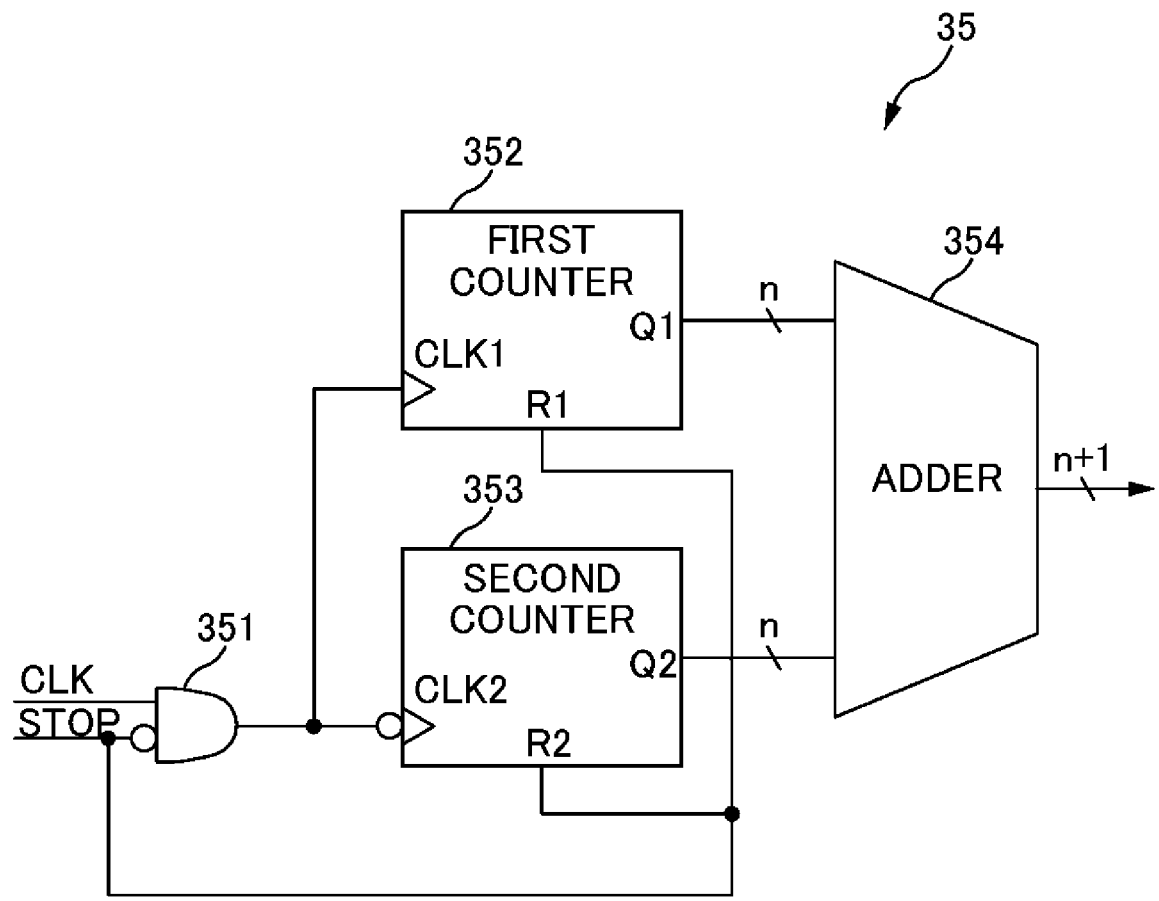
FIG. 1 is a block diagram of an exemplary configuration of a counter circuit to be used in a signal detection circuit of a magnetic sensor according to one embodiment of the present invention.

FIG. 1 is a block diagram of an exemplary configuration of the counter circuit used in the signal detection circuit of the magnetic sensor according to an embodiment of the present invention. The count circuit 35 includes an AND gate (gate circuit) 351, a first counter 352, a second counter 353, and an adder 354.

In the AND gate 351, the clock CLK is input to one input terminal, and the digital signal STOP output from the hysteresis comparator 34 is inverted to be input to the other input terminal. That is, the AND gate 351 outputs the clock CLK when the digital signal STOP is at low-level.

The first counter 352 is a counter with n bits and includes a reset terminal R1, a clock terminal CLK1, and an output terminal Q1. The digital signal STOP is input to the reset terminal R1, and the clock CLK output from the AND gate 351 is input to the clock terminal CLK1 as a first clock. That is, when the digital signal STOP is at high-level, when the reset terminal R1 becomes high-level so that the first counter 352 is reset, and therefore, count of the first clock is prohibited. On the other hand, when the digital signal STOP is at low-level, the reset terminal R1 becomes low-level, so that reset of the first counter 352 is released, and therefore an rising edge of the first clock is counted, and a count result, which is an n-bit count value, is output from the output terminal Q1.

The second counter 353 is a counter with n bits and includes a reset terminal R2, a clock terminal CLK2, and an output terminal Q2. The digital signal STOP is input to the reset terminal R2 in common with the reset terminal R1, and a clock obtained by inverting the clock CLK output from the AND gate 351 is input to the clock terminal CLK2 as a second clock. That is, when the digital signal STOP is at high-level, the reset terminal R2 becomes high-level, so that the second counter 353 is reset, and therefore, count of the second clock is prohibited. On the other hand, when the digital signal STOP is at low-level, the reset terminal R2 becomes low-level, so that reset of the second counter 353 is released, and therefore, the rising edge of the second clock is counted and a count result, which is an n-bit count value, is output from the output terminal Q2.

Since the first clock and the second clock are in a reversed-phase relationship where clocks are inverted in phase from each other, the rising edge of the second clock is simultaneous with the falling edge of the first clock. That is, during a period of low-level of the digital signal STOP, an operation of counting the rising edge of the second clock with the second counter 353 is equivalent to an operation of counting the falling edge of the first clock.

The adder 354 adds a count value output from the first counter 352 and a count value output from the second counter 353, and outputs the added result.

Operation of Count Circuit 35

Figure 2:
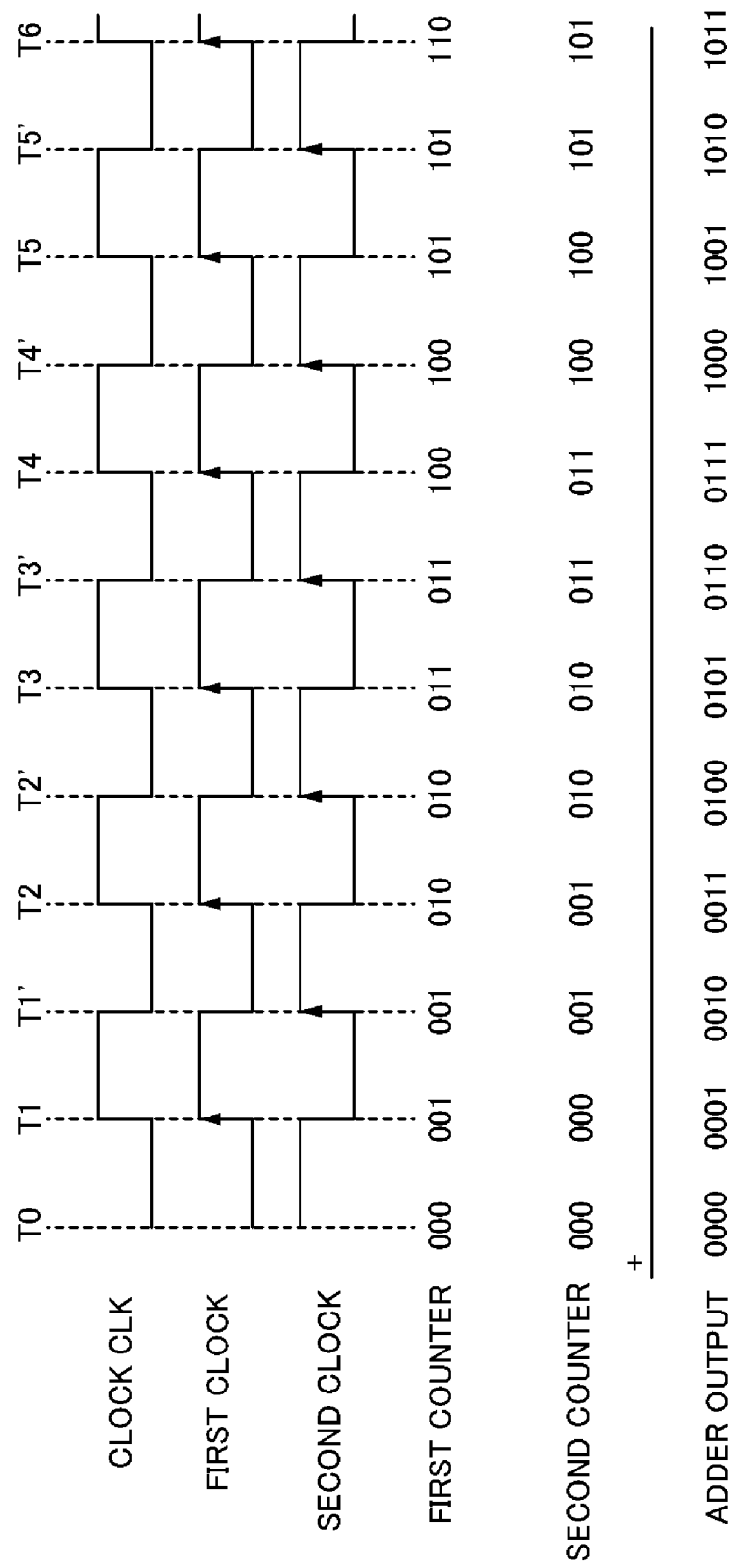
FIG. 2 is a timing chart of an operation of a counter circuit shown in FIG. 1.

FIG. 2 is a timing chart of an operation of the counter circuit shown in FIG. 1.

An operation of the counter circuit 35 of FIG. 1 will hereinafter be described with reference to the timing chart shown in FIG. 2. For convenience of description, description will be made assuming that the number of bits of each of the first counter 352 and the second counter 353 is n=3.

First, it is assumed that the digital signal STOP falls and changes in level from high-level to low-level at time T0. That is, since the digital signal STOP is at high-level until the time T0, both the first counter 352 and the second counter 353 are reset and prohibited from performing an count operation, and three-bit data remains "000" which is output from each of the output terminal Q1 of the first counter 352 and the output terminal Q2 of the second counter 353.

At the time T0, and thereafter, the reset of the first counter 352 and the second counter 353 is released since the digital signal STOP becomes low-level. That is, the first counter 352 sequentially counts the rising edges of the first clock to be subsequently input, while the second counter 353 sequentially counts the rising edges of the second clock to be subsequently input.

Therefore, the first counter 352 increments the three-bit count value by +1 at the timing of times T1, T2, T3, T4, T5, T6, etc., at which the first clock rises, while the second counter 353 increments the three-bit count value by +1 at the timing of times T1', T2', T3', T4', T5', etc., at which the second clock rises.

That is, the three-bit count value output from the first counter 352 is changed at each cycle by +1 at the rising edge of the first clock as a base point, and the three-bit count value output from the second counter 353 is changed at each cycle by +1 at the rising edge of the second clock as a base point. In other words, any one of the count values of the first counter 352 and the second counter 353 is changed at every half cycle of the clock CLK. Since the adder 354 adds the count values of the first counter 352 and the second counter 353, which are changed at each half cycle of the clock CLK, a result of the addition in the adder 354 itself is also incremented by +1 at every half cycle.

Specific description will be made with taking up the count values of the first counter 352 and the second counter 353 between the times T3 and T4', for example.

At the time T3, since this is the timing of rising of the first clock, the first counter 352 performs an increment operation and the count value of the first counter 352 is changed from "010" to "011". This count value is held until the first clock rises again at the time T4. On the other hand, since the second clock falls, the second counter 353 does not perform the counting and the count value thereof remains "010". Therefore, an addition value output from the adder 354 is "0101".

At the time T3', since this is the timing of rising of the second clock, the second counter 353 performs the increment operation and the count value of the second counter 353 is changed from "010" to "011". This count value is held until the second clock rises again at the time T4'. On the other hand, since the first clock falls, the first counter 352 does not perform the counting and the count value thereof remains "011". Therefore, the addition value output from the adder 354 is "0110".

At the time T4, since this is the timing of rising of the first clock, the first counter 352 performs the increment operation and the count value of the first counter 352 is changed from "011" to "100". This count value is held until the first clock rises again at time T5. On the other hand, since the second clock falls, the second counter 353 does not perform the counting and the count value thereof remains "011". Therefore, the addition value output from the adder 354 is "0111".

At the time T4', since this is the timing of rising of the second clock, the second counter 353 performs the increment operation and the count value of the second counter 353 is changed from "011" to "100". This count value is held until the second clock rises again at the time T5'. On the other hand, since the first clock falls, the first counter 352 does not perform the counting and the count value thereof remains "100". Therefore, the addition value output from the adder 354 is "1000".

As described above, by using the clock CLK without changing frequency thereof, the four-bit addition value changing at every half cycle of the clock CLK can be obtained from the adder 354. That is, although the number of bits is three for each of the first counter 352 and the second counter 353, by using the clock CLK, there can be obtained the count result equivalent to that to be obtained by a four-bit counter performing the count operation with the use of a clock having a frequency two times greater than that of the clock CLK. Therefore, since the addition value obtained from the adder 354 is one bit greater than each count value of the first counter 352 and the second counter 353, the addition value includes information amount two times greater than each information amount of the first counter 352 and the second counter 353.

The four-bit addition value output from the adder 354, i.e., the four-bit count value output from the count circuit 35 is stored in the memory 411 in the control circuit 411 and thereafter, transmitted to the microcomputer 71 to execute a calculation process for acquiring direction data corresponding to the count value.

Figure 5:
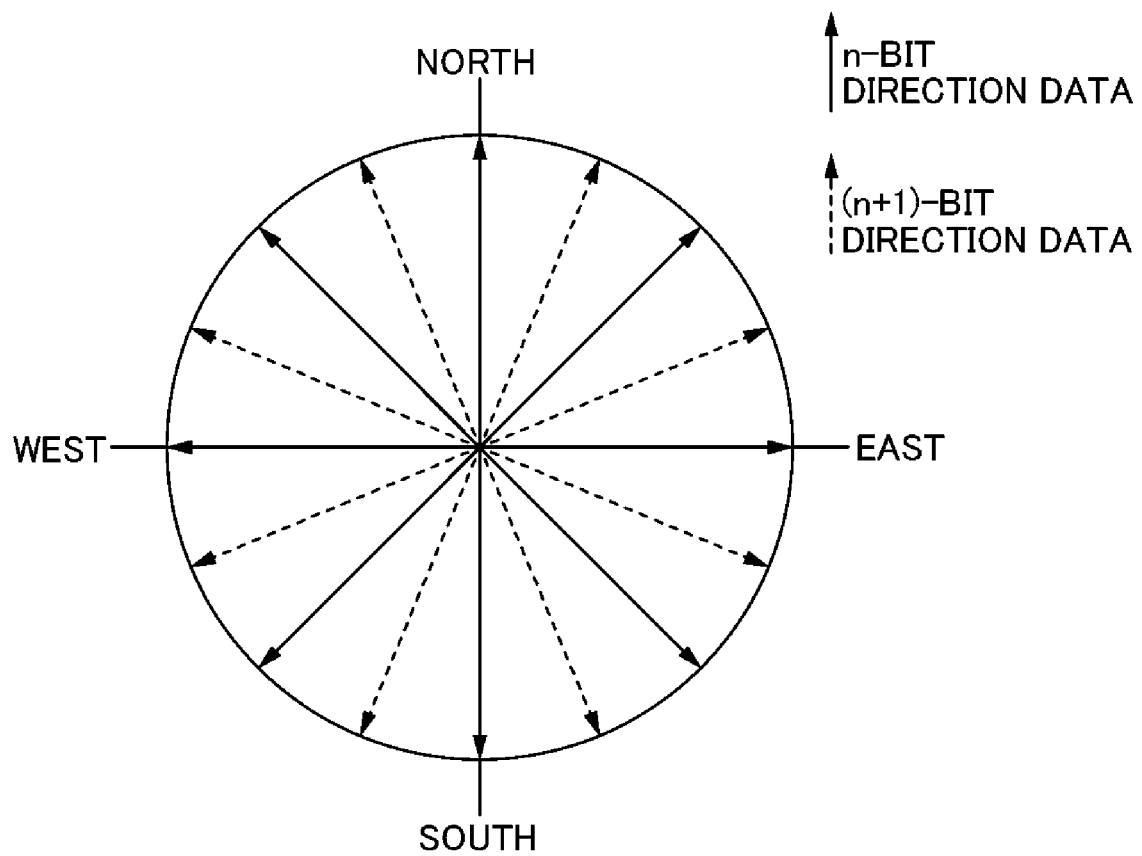
FIG. 5 is a diagram showing directions to be identified based on direction data.

FIG. 5 is a diagram showing directions to be identified based on the direction data. If the count value output from the count circuit 35 is three-bit, eight types of direction data can be obtained, and directions obtained based on the direction data are shown by solid-line vectors. However, in an embodiment of the present invention, since the count value output from the count circuit 35 is four-bit and 16 types of direction data can be obtained, directions obtained based on this direction data are not only directions shown by the solid-line vectors but also directions shown by dashed-line vectors drawn in between the adjacent solid-line vectors. Therefore, the resolution of the direction measurement of the fluxgate magnetometer can be improved double in accuracy without changing the frequency of the clock CLK. This is not limited to the case of n=3 and is attributable to the fact that the information amount obtained from a count value is doubled when the number of bits of the count value is increased by one.

As described above, according to a signal detection circuit of an embodiment of the present invention, when two n-bit counters and an adder is provided therein, there can be obtained a result equivalent to that in a case of using an n+1 bit counter that performs counting with a clock with a frequency greater than that of the clock CLK without changing the frequency of the clock CLK. Therefore, the fluxgate magnetometer can obtain direction data having twice as much information amount regarding directions. In this case, since the frequency of the clock CLK can be used without change, another oscillation source for the clock is not necessary, and since clock frequency is not increased, generation of noise can be reduced to prevent the fluxgate magnetometer from malfunctioning so that accurate direction data can be obtained. Moreover, the resolution required for the direction measurement of the fluxgate magnetometer can be improved double in accuracy without changing the frequency of the clock CLK.

The first clock and the second clock have phases inverted from each other, and the count value output from the count circuit 35 is incremented in every half cycle of the first clock and the second clock. That is, since the count value output from the count circuit 35 is always changed at the same interval, the count value is stored in the memory 411 of the control circuit 41 with reliability, and the calculate process for obtaining a direction by the microcomputer 71 becomes accurate.

The second clock is a clock obtained by inverting the first clock. That is, since the two first and second clocks are generated, one clock may be provided in the case of non-self-oscillating and one oscillation circuit may be provided in the case of self-oscillating, so that the number of components can be reduced. Especially, when a signal detection circuit according to an embodiment of the present invention is integrated, in order to obtain the first and second clocks, only one clock input terminal is needed when using the clock CLK of the non-self-oscillating and one oscillation circuit may be provided when using the clock CLK the self-oscillating, so that a chip area can accordingly be reduced.

Since the AND gate 351 is provided between the clock CLK and inputs of the first counter 352 and the second counter 353, the first counter 352 and the second counter 353 can accurately determine a period of counting. Therefore, the microcomputer 71 can accurately determine a direction based on direction data corresponding to an accurate count value.

Other Embodiments

The above embodiments of the present invention are simply for facilitating the understanding of the present invention and are not in any way to be construed as limiting the present invention. The present invention may variously be changed or altered without departing from its spirit and encompass equivalents thereof.

For example, although an input clock is only the clock CLK in an exemplary configuration of FIG. 1, this is not a limitation. The first clock and the second clock, which are separate in the reversed-phase relationship from each other, may be input to the first counter and the second counter, respectively. If the first clock and the second clock are separate clocks, the phases may not only be reversed but different in a manner other than reversal as long as a cycle is the same, and the first counter and the second counter may perform counting at combinations of the rising edge of the first clock and the rising edge of the second clock; the rising edge of the first clock and the falling edge of the second clock; the falling edge of the first clock and the rising edge of the second clock; and the falling edge of the first clock and the falling edge of the second clock.

What is claimed is:

1. A signal detection circuit for a magnetic sensor including an exciting coil and a detection coil, the signal detection circuit comprising:
    a differential amplifier to be applied with an output voltage of the detection coil at a time when a first drive signal is applied to a first terminal of the exciting coil and a second drive signal is applied to a second terminal of the exciting coil, the second drive signal being a signal inverted in polarity with respect to the first drive signal as well as intersecting the first drive signal twice or more;

a comparator configured to output a digital signal being at one logic level in a period between two spike-shaped voltages adjacent to each other in an output voltage of the differential amplifier due to intersection of the first drive signal and the second drive signal; and a count circuit configured to perform a count operation in a period during which the comparator outputs the digital signal of the one logic level, the count circuit including a first counter configured to count a first clock having a predetermined frequency, a second counter configured to count a second clock being equal in frequency to and different in phase from the first clock, the second counter having the same number of bits as the number of bits of the first counter, and an adder configured to add count values of the first counter and the second counter.

2. The signal detection circuit of claim 1, wherein the first clock and the second clock are in a reversed-phase relationship, wherein the first counter counts a change in the first clock from one logic level to the other logic level, and wherein the second counter counts a change in the second clock from the one logic level to the other logic level.

3. The signal detection circuit of claim 2, wherein the second clock is an inverted clock of the first clock.

4. The signal detection circuit of claim 1, further comprising a gate circuit configured to permit the first clock and the second clock to be input to the first counter and the second counter for a predetermined period.

* * * * *